United States Patent
Furutani et al.

(10) Patent No.: US 9,332,657 B2
(45) Date of Patent: May 3, 2016

(54) MULTILAYER PRINTED WIRING BOARD AND METHOD FOR MANUFACTURING MULTILAYER PRINTED WIRING BOARD

(71) Applicants: Toshiki Furutani, Ogaki (JP);
Yukinobu Mikado, Ogaki (JP);
Mitsuhiro Tomikawa, Ogaki (JP);
Tomoya Terakura, Ogaki (JP)

(72) Inventors: Toshiki Furutani, Ogaki (JP);
Yukinobu Mikado, Ogaki (JP);
Mitsuhiro Tomikawa, Ogaki (JP);
Tomoya Terakura, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 740 days.

(21) Appl. No.: 13/629,961

(22) Filed: Sep. 28, 2012

(65) Prior Publication Data
US 2013/0081870 A1 Apr. 4, 2013

(30) Foreign Application Priority Data

Sep. 30, 2011 (JP) ................................. 2011-217768

(51) Int. Cl.
| | |
|---|---|
| *H05K 1/16* | (2006.01) |
| *H05K 1/18* | (2006.01) |
| *H05K 3/44* | (2006.01) |
| *H05K 3/46* | (2006.01) |

(52) U.S. Cl.
CPC ............... *H05K 3/445* (2013.01); *H05K 1/185* (2013.01); *H05K 3/4608* (2013.01); *H05K 3/4644* (2013.01); *H05K 2201/10015* (2013.01); *Y10T 29/4913* (2015.01)

(58) Field of Classification Search
None
See application file for complete search history.

(56) References Cited

U.S. PATENT DOCUMENTS

| | | | | |
|---|---|---|---|---|
| 6,499,214 | B2 * | 12/2002 | Li et al. ............................ | 29/831 |
| 6,952,049 | B1 * | 10/2005 | Ogawa et al. ................. | 257/700 |
| 6,998,540 | B2 * | 2/2006 | Belke et al. ..................... | 29/830 |
| 7,152,315 | B1 * | 12/2006 | Paruchuri ........................ | 29/831 |
| 2003/0137056 | A1 * | 7/2003 | Taniguchi et al. ............ | 257/774 |
| 2007/0044999 | A1 * | 3/2007 | Shibata et al. ................ | 174/262 |
| 2007/0074900 | A1 * | 4/2007 | Lee et al. ...................... | 174/260 |
| 2011/0203836 | A1 * | 8/2011 | Yokota et al. ................. | 174/250 |
| 2012/0228015 | A1 * | 9/2012 | Ho ................................ | 174/260 |
| 2013/0003314 | A1 * | 1/2013 | Igarashi et al. ............... | 174/251 |

FOREIGN PATENT DOCUMENTS

| | | |
|---|---|---|
| JP | 2004-311849 | 11/2004 |
| JP | 3926736 | 6/2007 |

* cited by examiner

*Primary Examiner* — Chau N Nguyen
*Assistant Examiner* — Roshn Varghese
(74) *Attorney, Agent, or Firm* — Oblon, McClelland, Maier & Neustadt, L.L.P (57) ABSTRACT

A method for manufacturing a multilayer printed wiring board includes preparing a metal layer having metal member portions and connector portions connecting the metal member portions, forming laminated multilayer structures having electronic components and the metal member portions, respectively, forming cut penetrating holes in the connector portions of the metal layer, respectively, such that the connector portions of the metal layer are cut, and forming interlayer insulation layers on the laminated multilayer structures such that the laminated multilayer structures are interposed between the interlayer insulation layers. The forming of the interlayer insulation layers includes filling the cut penetrating holes with a resin derived from one or more interlayer insulation layers on the laminated multilayer structures.

4 Claims, 11 Drawing Sheets

MULTILAYER PRINTED WIRING BOARD AND METHOD FOR MANUFACTURING MULTILAYER PRINTED WIRING BOARD

CROSS-REFERENCE TO RELATED APPLICATIONS

The present application is based upon and claims the benefit of priority to Japanese Patent Application No. 2011-217768, filed Sep. 30, 2011, the entire contents of which are incorporated herein by reference.

BACKGROUND OF THE INVENTION

1. Field of the Invention

The present invention relates to a multilayer printed wiring board formed by laminating interlayer insulation layers and conductive circuits on a core substrate, where insulation layers are laminated on a metal plate and an electronic component is built into an opening, and by electrically connecting the upper and lower surfaces by through holes. The present invention also relates to a method for manufacturing such a multilayer printed wiring board.

2. Discussion of the Background

Japanese Patent No. 3926736 and Japanese Laid-Open Patent Publication No. 2004-311849 describe a multilayer printed wiring board where a metal plate with high thermal conduction is positioned in an inner layer of a core substrate. In the manufacturing method of Japanese Patent No. 3926736, an individual wiring board is obtained by forming an opening at a connected portion that connects between slits. The manufacturing method of Japanese Laid-Open Patent Publication No. 2004-311849 includes forming a resin layer on a panel where individual metal plates are connected by tie bars, and dividing individual metal plates by cutting the tie bars by router processing. The entire contents of these publications are incorporated herein by reference.

SUMMARY OF THE INVENTION

According to one aspect of the present invention, a method for manufacturing a multilayer printed wiring board includes preparing a metal layer having metal member portions and connector portions connecting the metal member portions, forming laminated multilayer structures having electronic components and the metal member portions, respectively, forming cut penetrating holes in the connector portions of the metal layer, respectively, such that the connector portions of the metal layer are cut, and forming interlayer insulation layers on the laminated multilayer structures such that the laminated multilayer structures are interposed between the interlayer insulation layers. The forming of the interlayer insulation layers includes filling the cut penetrating holes with a resin derived from one or more interlayer insulation layers on the laminated multilayer structures.

According to another aspect of the present invention, a multilayer printed wiring board has a core substrate including a metal member and having a first surface and a second surface on the opposite side of the first surface, a first buildup structure including a first insulation layer formed on the first surface of the core substrate, a first conductive circuit formed on the first insulation layer and interlayer insulation layers, a second buildup structure including a second insulation layer formed on the second surface of the core substrate, a second conductive circuit formed on the second insulation layer and interlayer insulation layers, a through-hole conductor penetrating through the core substrate, the first insulation layer and the second insulation layer such that the through-hole conductor is connecting the first conductive circuit and the second conductive circuit, and an electronic component accommodated in an accommodation portion formed through the core substrate, the first insulation layer and the second insulation layer. The metal member of the core substrate has a side surface having a concave portion which is recessed toward center of the metal member in a planar direction with respect to the core substrate, and the concave portion is covered with a resin derived from one or more interlayer insulation layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 9(A)-(B) are plan views showing a metal sheet which contains metal members of the first embodiment: FIG. 9(A) shows a state before processing, and FIG. 9(B) shows a state after processing;

DETAILED DESCRIPTION OF THE EMBODIMENTS

The embodiments will now be described with reference to the accompanying drawings, wherein like reference numerals designate corresponding or identical elements throughout the various drawings.

Figure 8:
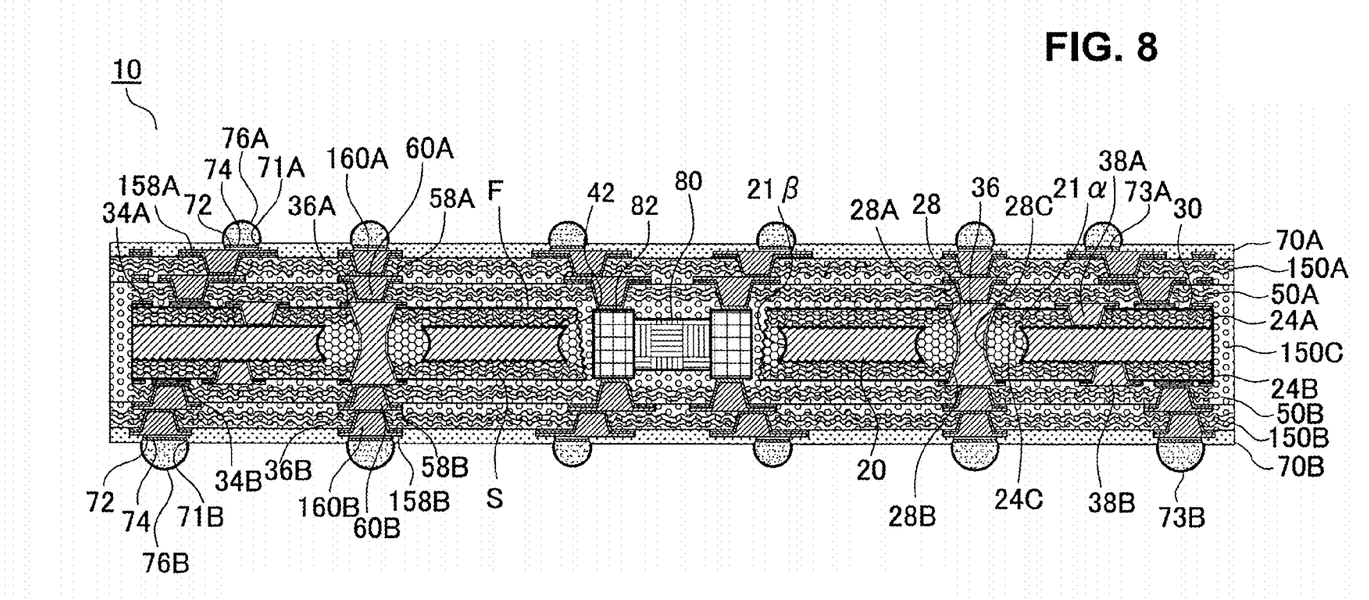
FIG. 8 is a cross-sectional view showing a multilayer printed wiring board of the embodiment before an IC chip is mounted.

Multilayer printed wiring board 10 of a first embodiment is described by referring to FIG. 8. FIG. 8 is a cross-sectional view of multilayer printed wiring board 10. In multilayer printed wiring board 10, first conductive circuits (34A) and first through-hole lands (36A) are formed on first surface (F) of core substrate 30 which contains metal member 20 inside, and second conductive circuits (34B) and second through-hole lands (36B) are formed on the second surface. Capacitor component 80 is accommodated in second penetrating hole (21β) of metal member 20. First conductive circuits and second conductive circuits as well as first through-hole lands (36A) and second through-hole lands (36B) are connected by through-hole conductors 36.

Surface (F) side first interlayer insulation layer (50A) is formed on first surface (F) of core substrate 30 and on first conductive circuits (34A). Conductive circuits (58A) are formed on first interlayer insulation layer (50A). Conductive circuits (58A) on surface (F) side first interlayer insulation layer (50A) are connected to first conductive circuits (34A), through-hole conductors 36 and electrodes 82 of capacitor component 80 by via conductors (60A) which penetrate through first interlayer insulation layer (50A).

Third interlayer insulation layer (150A) is formed as an upper layer of surface (F) side first interlayer insulation layer (50A). Conductive circuits (158A) are formed on third interlayer insulation layer (150A). Conductive circuits (158A) on surface (F) side third interlayer insulation layer (150A) are connected to conductive circuits (58A), via conductors (60A) and electrodes 82 of capacitor component 80 by via conductors (160A) which penetrate through third interlayer insulation layer (150A).

Surface (S) side second interlayer insulation layer (50B) is formed on second surface (S) of core substrate 30 and on the second conductive circuits. Conductive circuits (58B) are formed on second interlayer insulation layer (50B). Conductive circuits (58B) on surface (S) side second interlayer insulation layer (50B) are connected to second conductive circuits (34B) or through-hole conductors 36 and electrodes 82 of capacitor component 80 by via conductors (60B) which penetrate through second interlayer insulation layer (50B).

Fourth interlayer insulation layer (150B) is formed as an upper layer of surface (S) side second interlayer insulation layer (50B). Conductive circuits (158B) are formed on fourth interlayer insulation layer (150B). Conductive circuits (158B) on fourth interlayer insulation layer (150B) are connected to conductive circuits (58B) or via conductors (60B) and electrodes 82 of capacitor component 80 by via conductors (160B) which penetrate through fourth interlayer resin insulation layer (150B).

Surface (F) side solder-resist layer (70A) is formed on surface (F) side third interlayer insulation layer (150A), and surface (S) side solder-resist layer (70B) is formed on surface (S) side fourth interlayer insulation layer (150B). Solder-resist layers (70A, 70B) on surfaces (S) and (F) have opening portions (71A, 71B) which expose via conductors (160A, 160B) and conductive circuits (158A, 158B). Upper surfaces of via conductors and conductive circuits exposed through opening portions (71A, 71B) work as solder pads (73A, 73B). Solder bumps (76A, 76B) are formed on solder pads (73A, 73B). An IC chip is mounted on surface (F) side solder bumps (76A), and the multilayer printed wiring board is connected to an external board such as a daughterboard or the like through surface (S) side solder bumps (76B).

Figure 11:
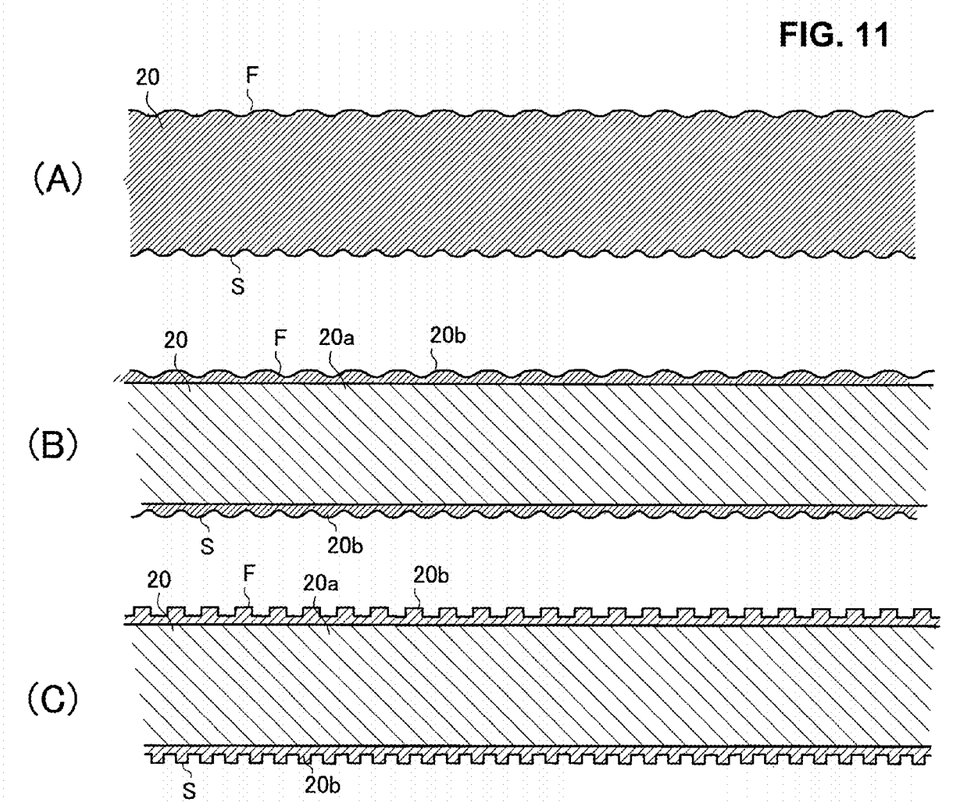
FIGS. 11(A)-(C) are cross-sectional views of a metal member of the first embodiment.

FIG. 11 shows enlarged views of metal member 20 contained in the center of core substrate 30 shown in FIG. 8.

The material of metal member 20 is preferred to be copper or an Fe—Ni alloy. Since thermal conduction is high in copper or in an Fe—Ni alloy, it is thought that heat is diffused in the core substrate, thus preventing thermal stress caused by uneven heat distribution in the core substrate. Metal member 20 has a thickness in a range of 20 μm to 100 μm. If the thickness of metal member 20 is 20 μm or less, it is thought that the effect of thermal diffusion is not achieved. On the other hand, if the thickness of metal member 20 is 100 μm or greater, it is thought that warping occurs because its thermal expansion coefficient is different from that of insulation layers of the core substrate. The upper surface and its opposing lower surface are each roughened to secure adhesiveness with first and second insulation layers to be laminated on surfaces of metal member 20. Their surface roughness is preferred to be in a range of Rz=2.0~6.0 μm. It is thought that the adhesiveness is low if Rz is smaller than 2.0 μm, and the flatness of insulation layers is low if Rz is greater than 6.0 μm. Each surface roughness is measured by a laser microscope made by Keyence, for example. It is an option for surface roughness of the first surface and the second surface of metal member 20 to be different from each other (FIG. 11(A)). The surface roughness of first surface (F) is preferred to be in a range of Rz=3.5~6.0 μm, and the surface roughness of second surface (S) in a range of Rz=2.0~3.0 μm. When an IC chip is mounted, the side opposite a mounted IC chip side is convex, and higher adhesiveness is thought to be required for the concave side.

Plated film may be formed on the first surface and second surface of metal member 20. For example, as shown in FIG. 11(B), the core section of metal member 20 is made of Fe—Ni alloy layer (20a), and upper and lower surfaces of the Fe—Ni layer are plated with copper-plated films (20b). The thickness of metal member 20 is adjustable by plating. Moreover, by forming roughened surfaces or concavo-convex shapes (FIG. 11(C)) on copper-plated films (20b), adhesiveness with insulation layers is thought to be enhanced.

Metal member 20 of core substrate 30 is used as a power-source conductor, and via conductors (38A, 38B) connected to metal member 20 are used for power source. On the other hand, through-hole conductors 36 are used for signals. It is an option to use metal member 20 as a ground conductor.

FIG. 10(E) is a view of metal member 20 in FIG. 8 projected from a lamination direction. In FIG. 10(D), connectors (20γ) of metal member 20 are cut from other metal members 20. Each connector (20γ) is cut by a drill so that it does not protrude from metal member 20. Accordingly, on side surfaces of metal member 20, metal member 20 has concave portions (20ω) that are recessed in an arc shape toward the center of metal member 20 in a planar direction. Since connectors (20γ) are cut by a drill, stress is less likely to be exerted on metal member 20 during cutting. Accordingly, it is thought that concavo-convex shapes, caused by warping of metal member 20 due to stress, are prevented from occurring on surfaces of insulation layers, and it is easier to maintain flat surfaces. Since interlayer insulation layers and conductive circuits are laminated to be built up on flat insulation layers, reliability of conductive circuits is thought to be enhanced.

Concave portions (20ω) which are recessed at a side surface toward the center of metal member 20 in a planar direction are filled with resin (150C) that has seeped from third interlayer insulation layer (150A) and fourth interlayer insulation layer (150B). Resin (150C) to be filled is derived from at least either third interlayer insulation layer (150A) or fourth interlayer insulation layer (150B). It is an option for the interlayer insulation layers to contain inorganic fiber such as glass fiber.

On side portions of core substrate 30 in FIG. 8, concave portions (20ω) recessed in an arc shape toward the center of metal member 20 in a planar direction are filled with resin (150C), and there is a region on each side surface of substrate 30 where no inorganic fiber of insulation layers is present. Since stress is less likely to be concentrated in boundaries of concave portions (20ω) and resin (150C) due to their shapes, it is thought that cracking that originated in concave portions (20ω) is unlikely to occur in resin (150C), or that insulation layers (24A, 24B) are unlikely to be delaminated from metal member 20.

Through-hole conductor 36 formed in core substrate 30 shown in FIG. 8 is formed inside third penetrating hole 28, which is made up of first opening portion (28A), second opening portion (28B) and third opening portion (28C) that penetrate through core substrate 30. Through-hole conductor 36 connects first conductive circuit (34A) and second conductive circuit (34B). Through-hole conductor 36 is made of plated metal filled in third penetrating hole 28. Copper is preferred for such metal. Third penetrating hole 28 is made up of first opening portion (28A) formed by irradiating a laser from the first-surface (F) side of core substrate 30 toward the second surface, second opening portion (28B) formed by irradiating a laser from the second-surface (S) side of the core substrate toward the first surface, and third opening portion (28C) formed by irradiating a laser at first penetrating hole (21α) filled with resin material.

A straight line passing through the gravity center of first opening portion (28A) and perpendicular to the first surface of the core substrate may be offset from a straight line passing through the gravity center of second opening portion (28B) and perpendicular to the second surface of the core substrate. When first opening portion (28A) and second opening portion (28B) are connected while being offset in third opening portion (28C), the surface area of inner walls of third penetrating hole 28 increases compared with situations where holes are not offset. Thus, adhesiveness is thought to be enhanced between through-hole conductor 36 and the insulation layer and resin material.

In the above embodiment, through-hole conductor 36 made by filling plated metal tapers from first surface (F) (upper surface) of core substrate 30 toward second surface (S) (lower surface) while tapering from the second surface toward the first surface. Through-hole conductor 36 has the smallest diameter in third opening portion (28C). Since the distance becomes greatest at that position between through-hole conductor 36 as a signal conductor and metal member 20 as a power-source conductor, impact from noise is thought to decrease. Here, at the position where the diameter of through-hole conductor 36 becomes smallest, the distance from the first surface of metal member 20 in a depth direction and the distance from the second surface in a depth direction may either be the same or different in third opening portion (28C).

Fourth penetrating hole 42 to accommodate an electronic component is formed inside second penetrating hole (21β) in core substrate 30 shown in FIG. 8. Fourth penetrating hole 42 is formed by irradiating a laser from the first-surface (F) side of core substrate 30 toward the second surface. Fourth penetrating hole 42 tapers from first surface (F) (upper surface) of core substrate 30 toward second surface (S) (lower surface). When fourth penetrating hole 42 is formed to taper, it is easier to accommodate an electronic component from the first-surface side which has a larger opening diameter. The electronic component is any one of a capacitor component, a resistor component, an inductor component, an IC chip and a wiring board.

The electronic component accommodated in fourth penetrating hole 42 of core substrate 30 shown in FIG. 8 is secured in penetrating hole 42 with third fillers (48A, 48B), since the space between fourth penetrating hole 42 and the electronic component is filled with resin material from the first interlayer insulation layer and the second interlayer insulation layer, which are formed on upper and lower portions of the electronic component, on surfaces of the core substrate, and on upper portions of first conductive circuits (34A) and second conductive circuits (34B). Because the first interlayer insulation layer, the second interlayer insulation layer and third fillers (48A, 48B) are contiguous, it is thought that the electronic component and the first and second interlayer insulation layers are less likely to be delaminated, and thus the electronic component is surely secured.

Next, regarding multilayer printed wiring board 10 described above with reference to FIG. 8, a manufacturing method is described by referring to FIGS. 1~8. In the following, a capacitor component is used as an electronic component to be accommodated in the accommodation hole for an electronic component.

(1) Metal layer 20 made of copper with a thickness of 35 μm is prepared, where the surface roughness of first surface (F) is Rz=4.5 μm, and the surface roughness of second surface (S) is Rz=2.5 μm (FIG. 1(A)).

(2) As shown in FIG. 1(B), etching resists 22 are formed on the first and second surfaces of metal layer 20 so that first penetrating holes (21α) for through holes, second penetrating hole (21β) for accommodating a capacitor component, metal member 20 and connectors (20γ) are formed. Opening portions (22a) of etching-resist films on the first surface and second surface of metal layer 20 are formed to be at the same positions while sandwiching the metal layer.

Figure 9:
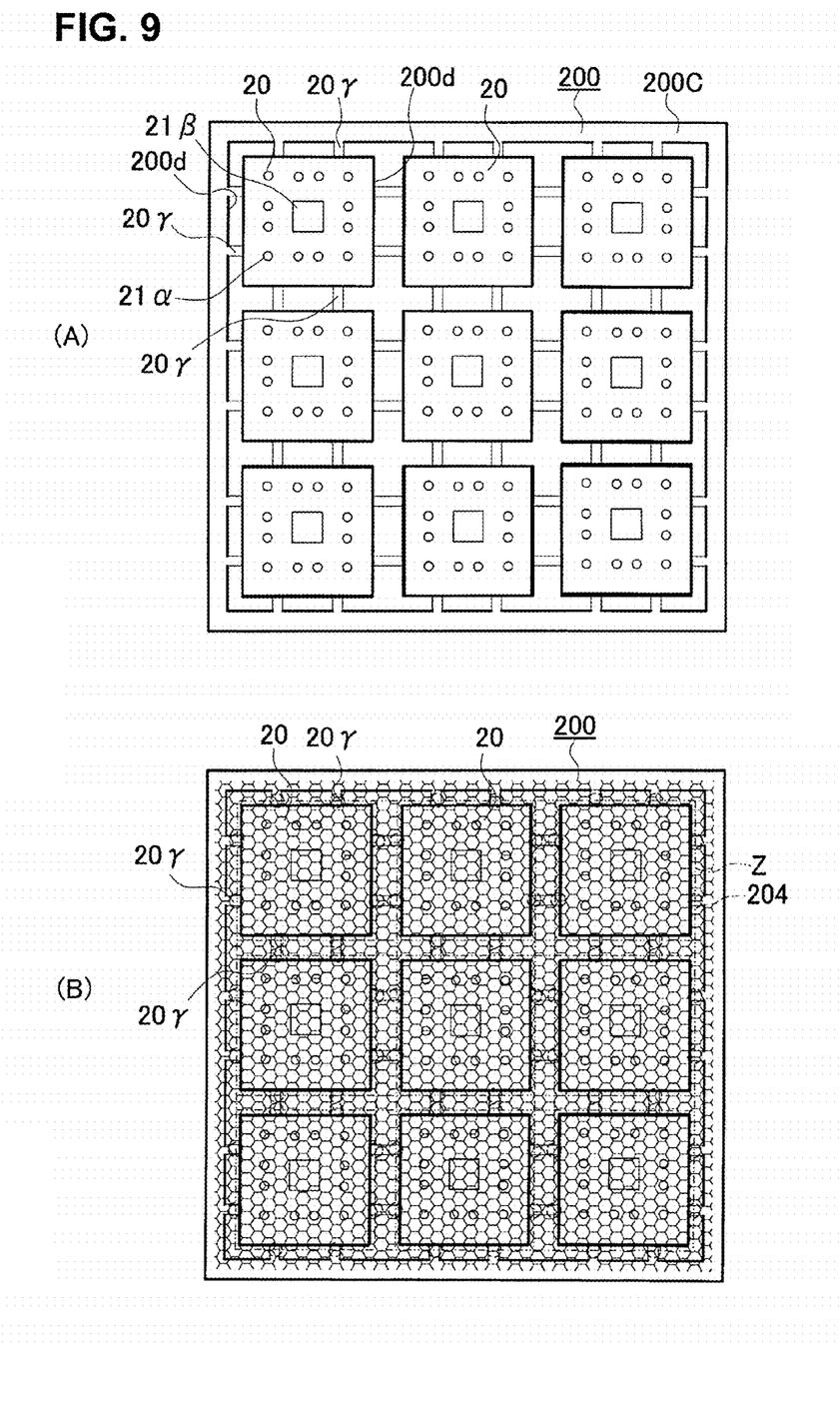
Figure 10:
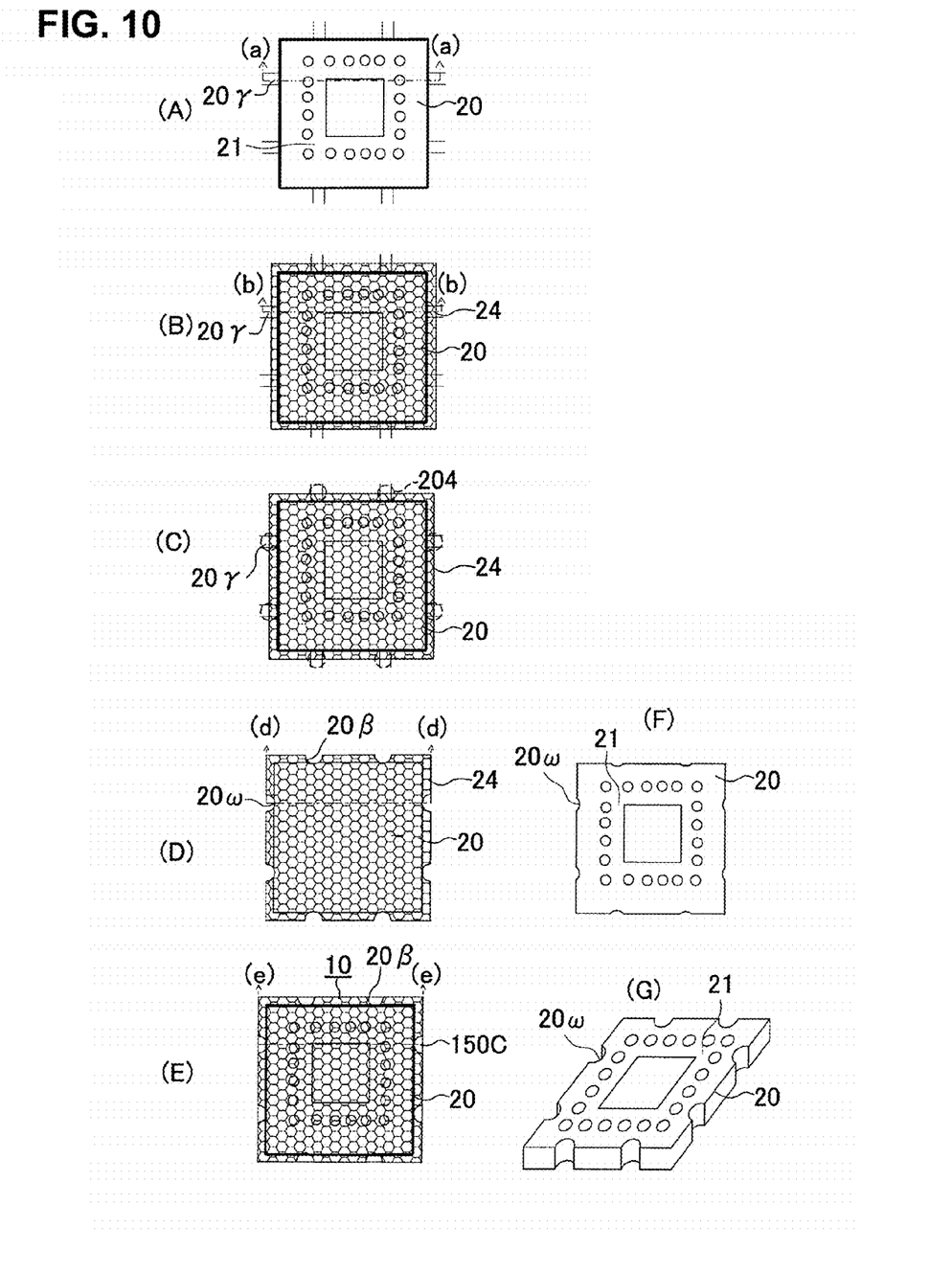
FIGS. 10(A)-(G) are plan views showing processing steps of a metal member according to the first embodiment.

(3) By etching metal layer 20 exposed from opening portions (22a) under the same conditions, metal sheet 200 (metal layer 20) is formed with metal member 20 having first multiple penetrating holes (21α) for through holes and one or multiple second penetrating holes (21β) for accommodating a capacitor component, along with connectors (20γ) (FIG. 1(C), FIG. 9(A), FIG. 10(A)). In FIGS. 9 and 10, a single second penetrating hole (21β) is formed for accommodating a capacitor component, but multiple holes may also be formed. The cross section at "a-a" in FIG. 1(C) corresponds to the cross section at "a-a" in FIG. 10(A). At that time, first penetrating holes (21α) for through holes in metal layer 20 are formed in a cross-sectional arc shape with a diameter increasing from the first-surface side and the second-surface side toward the center of metal layer 20, and the recesses on side walls are set to be 10 μm. Metal member 20, first penetrating holes (21α) and connectors (20γ) are formed at the same time. The diameter of first penetrating holes (21α) for through holes is 230 μm. It is an option to use blanking when forming the metal member and connectors.

(4) After metal sheet 200 is formed, the etching resist films are removed, and a coupling agent is applied on the first and second surfaces of metal layer 20 to enhance adhesiveness with insulation layers.

(5) First insulation layer (24A) and second insulation layer (24B) with copper foils (25A, 25B) are provided on the first and second surfaces of metal layer 20 (FIG. 1(D)). The layer thickness of first insulation layer (24A) and second insulation layer (24B) is 50 μm. The layer thickness of copper foils (25A, 25B) is 5 μm. The insulation layers are resin-impregnated core material made of inorganic fiber or the like such as glass cloth. The insulation layers may contain inorganic filler such as silica or alumina filler. In a step for forming first insulation layer (24A) and second insulation layer (24B) with copper foil on the first surface and second surface of metal layer 20, first insulation layer (24A) and second insulation layer (24B) with copper foil on one side are respectively laminated on the first surface and second surface of metal layer 20. Alternatively, it is an option to simultaneously laminate first insulation layer (24A) and copper foil (25A) as well as second insulation layer (24B) and copper foil (25B) respectively on the first surface and second surface of metal layer 20. Either method may be employed.

Resin material seeps out at least from either first insulation layer (24A) or second insulation layer (24B) during lamination so that first filler (24C) is filled in first penetrating holes (21α) formed in metal member 20 and second filler (24C) is filled in second penetrating hole (21β) in metal member 20 (FIG. 2(A)). FIG. 10(B) shows a plan view (cross section at "b-b") of first insulation layer (24A) and second insulation layer (24B) laminated on metal member 20.

(6) A black-oxide treatment is conducted on surfaces of copper foils (25A, 25B) (not shown in the drawings). Since a laser is used for forming penetrating holes for through holes, laser absorption is required to be enhanced.

(7) From the first surface of core substrate 30 toward the second surface, a CO2 gas laser is irradiated on the first surface while being aligned with positions of first penetrating holes (21α) so that first opening portions (28A) are formed on the first-surface side of core substrate 30 to penetrate at least through first insulation layer (24A). The opening diameter of first opening portions (28A) is 80 μm. However, the pulse width and the number of shots of laser irradiation are not limited specifically. From the first surface of core substrate 30 toward the second surface, a CO2 gas laser is irradiated so that via openings (26a) are formed to penetrate through first insulation layer (24A) on the first surface of metal member 20 (FIG. 2(B)). The opening diameter of via openings is 75 μm. First opening portions (28A) and via openings (26a) are formed consecutively.

(8) From the second surface of core substrate 30 toward the first surface, a CO2 gas laser is irradiated on the second surface while being aligned with positions of first penetrating holes (21α) so that second opening portions (28B) are formed on the second-surface side of core substrate 30 to penetrate at least through second insulation layer (24B). The opening diameter of second opening portions (28B) is 80 μm. However, the pulse width and the number of shots of laser irradiation are not limited specifically. From the second surface of core substrate 30 toward the first surface, a CO2 gas laser is irradiated so that via openings (26b) are formed to penetrate through second insulation layer (24B) on the second surface of metal member 20 (FIG. 2(C)). The opening diameter of via openings is 75 μm. Second opening portions (28B) and via openings (26b) are formed consecutively. Third penetrating holes 28 are made up of first opening portions (28A) and second opening portions (28B).

First opening portion (28A) is an opening portion that penetrates through first insulation layer (24A), second opening portion (28B) is an opening portion that penetrates through second insulation layer (24B), and third opening portion (28C) is an opening portion that penetrates through the filler in the first penetrating hole.

Third penetrating hole 28 is formed by connecting first opening portion (28A) and second opening portion (28B) inside third opening portion (28C). First opening portion (28A) tapers from the first-surface (F) side of core substrate 30 toward second surface (S). Second opening portion (28B) tapers from the second-surface (S) side of core substrate 30 toward first surface (F). The diameter of third penetrating hole 28 decreases as it goes toward the center of core substrate 30, and its smallest diameter is 40 μm. The smallest diameter of third penetrating hole 28 corresponds to the smallest diameter of third opening portion (28C). At the position where the diameter of third penetrating hole 28 becomes smallest in core substrate 30, the distance from the first surface of metal member 20 in a depth direction and the distance from the second surface in a depth direction may be the same or different in third opening portion (28C).

Straight lines passing through the gravity centers of laser openings for forming first opening portion (28A) and second opening portion (28B) respectively and perpendicular to first and second surfaces may overlap with each other or may be offset from each other. When first opening portion (28A) and second opening portion (28B) are connected while being offset in third opening portion (28C), the surface area of the inner walls of third penetrating hole 28 increases compared with situations where holes are not offset. Thus, adhesiveness is thought to be enhanced between through-hole conductor 36 and the insulation layer and resin material.

Forming third penetrating holes 28 is not limited to the above method. Penetrating holes may be formed by irradiating a laser only from either the first surface or the second surface of core substrate 30. Irradiation from only one direction does not result in defects such as failure to form an opening because the holes formed by irradiating a laser from both surfaces do not align. Alternatively, penetrating holes may be formed by a drill.

(9) Electroless plating is performed on surfaces of core substrate 30 where third penetrating holes 28 for through holes and via openings (26a, 26b) are formed, and on inner walls of third penetrating holes 28 and inner walls of via openings. Accordingly, electroless plated films 31 are formed (FIG. 2(D)).

(10) Photosensitive dry film is laminated on the copper foils with electroless plated film, exposed to light and developed. Accordingly, plating resists 40 with a predetermined pattern are formed (FIG. 3(A)).

(11) Electrolytic plated films 32 are formed by electrolytic plating performed on areas where plating resists 40 are not formed. Accordingly, conductive circuits 34, through-hole conductors 36 made by filling plating in third penetrating holes 28, and via conductors (38A, 38B) made by filling plating in openings (26a, 26b) are formed (FIG. 3(B)).

(12) Plating resists 40 are removed, electroless plated films 31 and copper foils (25A, 25B) under plating resists 40 are etched away, and conductive circuits (34A, 34B), through-hole conductors 36 and via conductors (38A, 38B) are formed, completing core substrate 30 (FIG. 30(C)). The layer thickness of conductive circuits (34A, 34B) is 15 μm.

(13) In first insulation layer (24A), second filler (24C) and second insulation layer (24B) inside second penetrating hole (21β) of metal layer 20, a laser is used to form tapering fourth penetrating hole 42 for accommodating a capacitor component (FIG. 3(D)). When accommodating a capacitor component, if the accommodation section tapers, it is less likely for the adsorption head with a capacitor component to touch the opening section, thus it is thought that secure accommodation is achieved. A laser is used here, but a drill may also be used.

(14) Roughened surface (42α) is formed on fourth penetrating hole 42 (FIG. 4(A)).

(15) Supporter 44 is formed on the side of second insulation layer (24B). Insulative tape is selected for supporter 44 (FIG. 4(B)).

(16) Capacitor component 80 is accommodated in fourth penetrating hole 42 (FIG. 4(C)). Here, only a single fourth penetrating hole 42 is shown. However, multiple holes may also be formed in a multilayer printed wiring board to accommodate a capacitor component in each opening. Alternatively, multiple capacitor components may be accommodated in one opening or in one or more openings.

(17) First interlayer insulation layer (50A) with copper foil (49A) is formed on first insulation layer (24A) (FIG. 1(D)). The layer thickness of first interlayer insulation layer (50A) is 50 μm. The layer thickness of copper foil (49A) is 5 μm. The insulation layer is a resin-impregnated core material made of inorganic fiber such as glass cloth. First interlayer insulation layer (50A) contains resin-impregnated core material, and may also contain inorganic filler such as silica and alumina in the resin. Third filler (48A) that has seeped during lamination from first interlayer insulation layer (50A) is filled in fourth penetrating hole 42 and in the gap with the capacitor component (FIG. 4(D)).

(18) After insulative tape 44 is removed, second interlayer insulation layer (50B) with copper foil (49B) is provided on second insulation layer (24B) (FIG. 1(D)). Fourth penetrating hole 42 is completely filled by third filler (48B) that has seeped during lamination from second interlayer insulation layer (50B) (FIG. 5(A)).

Figure 1:
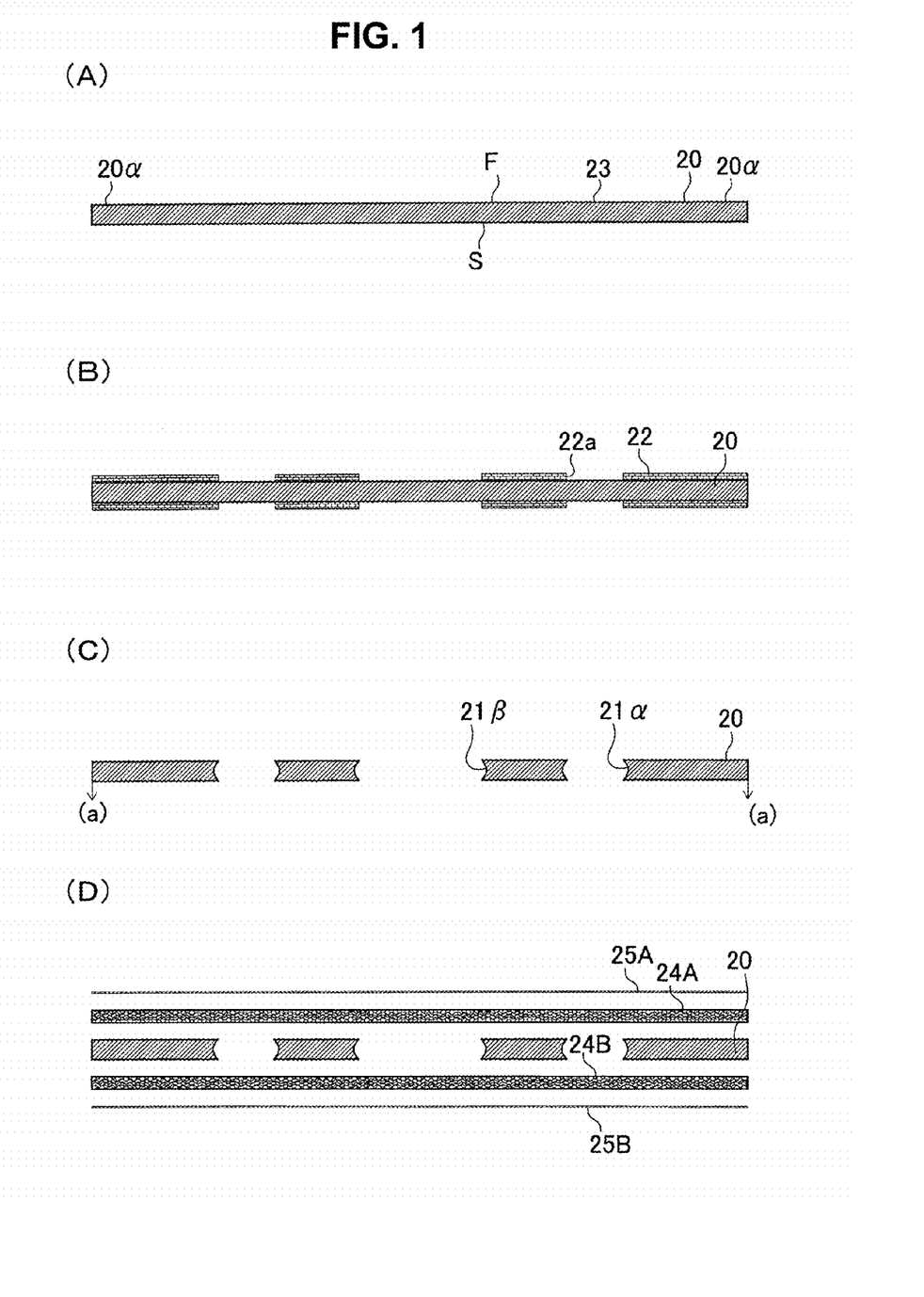
FIGS. 1(A)-(D) are views showing steps of a method for manufacturing a multilayer printed wiring board according to an embodiment of the present invention.
Figure 2:
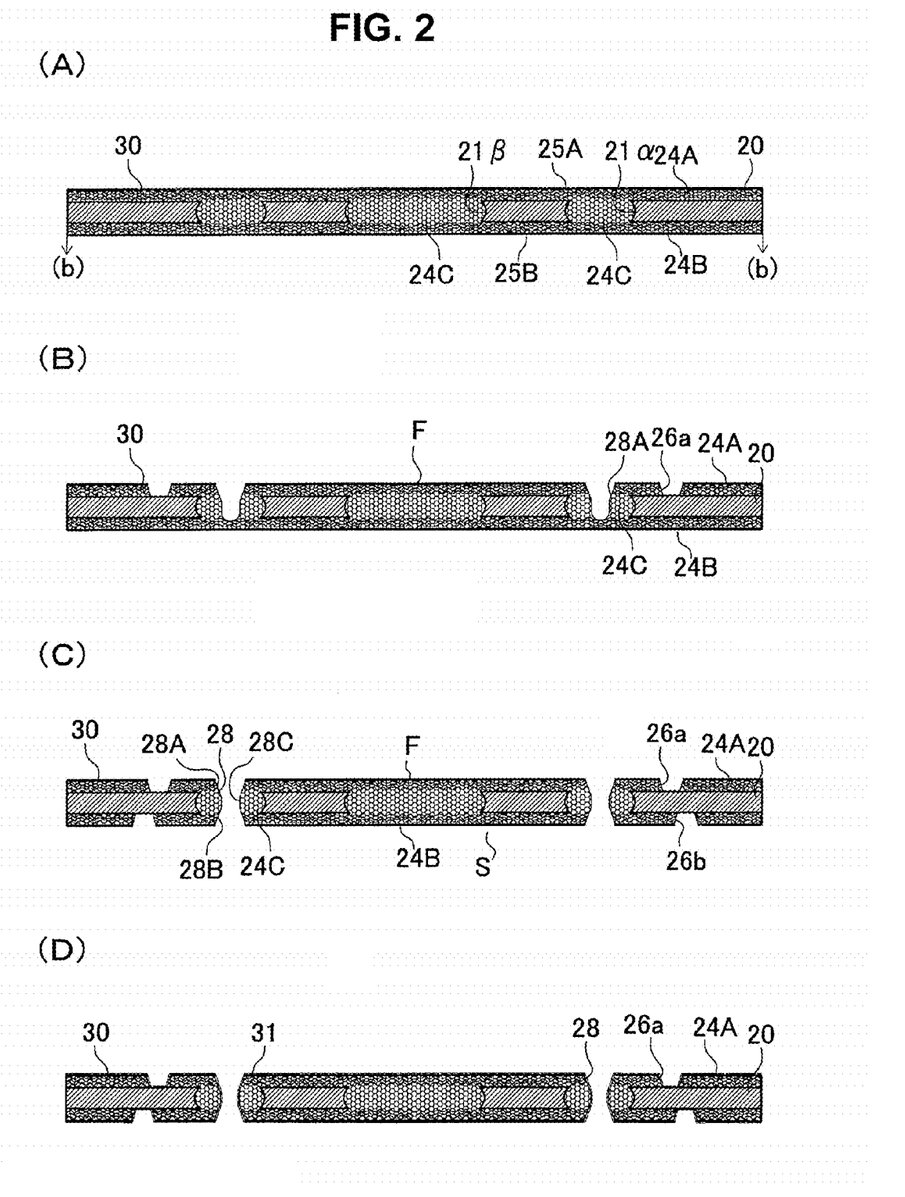
FIGS. 2(A)-(D) are views showing steps of a method for manufacturing a multilayer printed wiring board according to a first embodiment.
Figure 3:
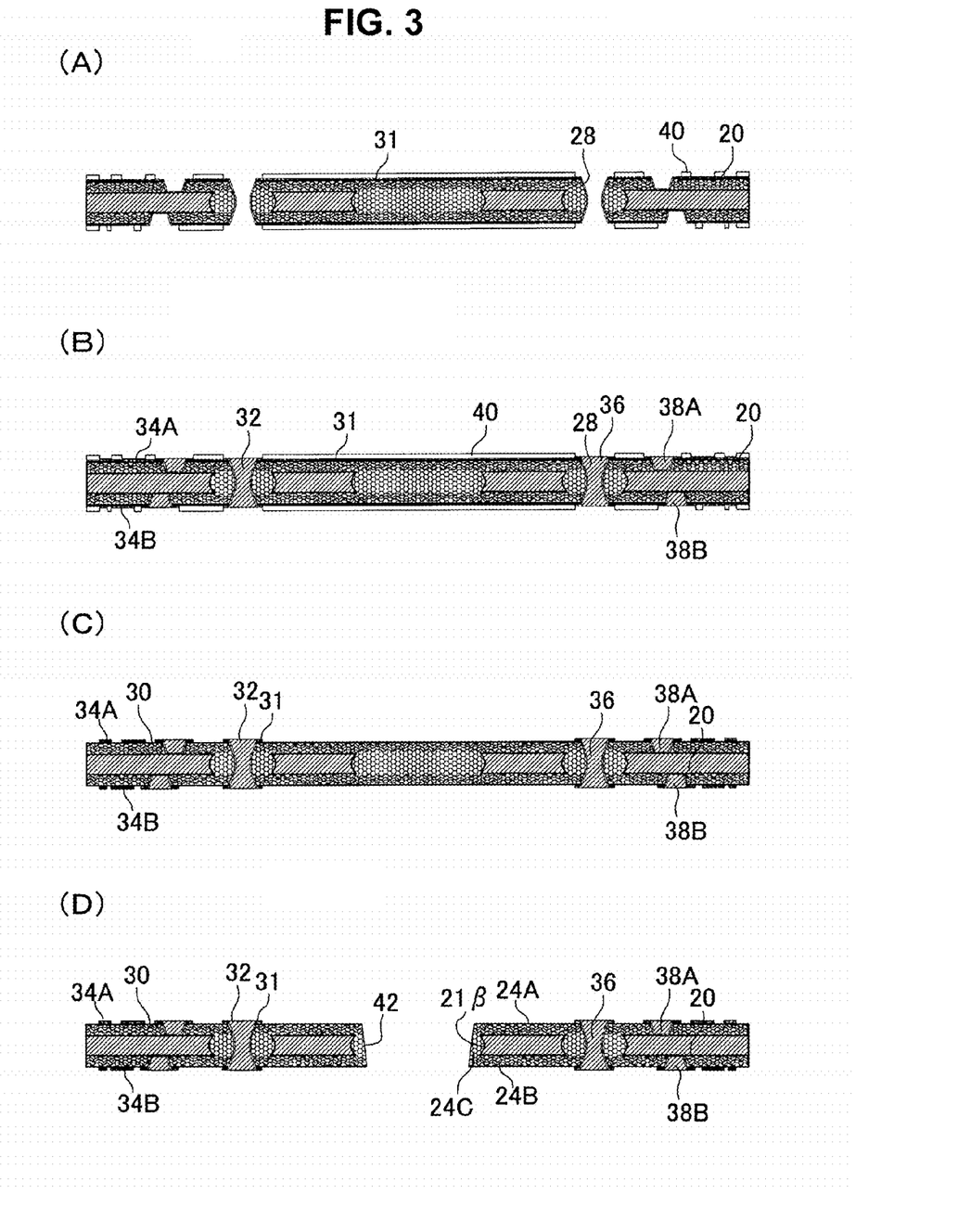
FIGS. 3(A)-(D) are views showing steps of a method for manufacturing a multilayer printed wiring board according to the first embodiment.
Figure 4:
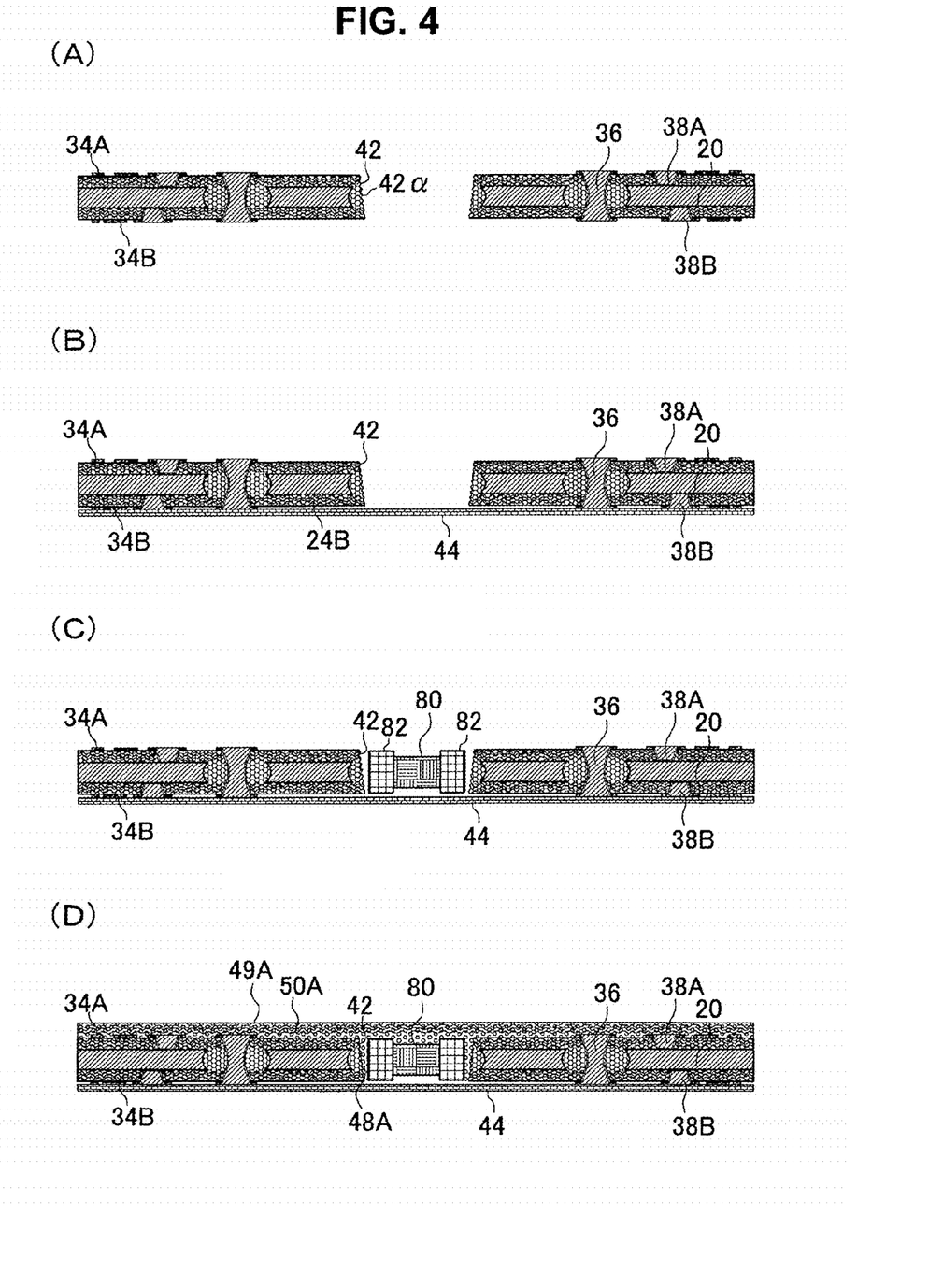
FIGS. 4(A)-(D) are views showing steps of a method for manufacturing a multilayer printed wiring board according to the first embodiment.
Figure 5:
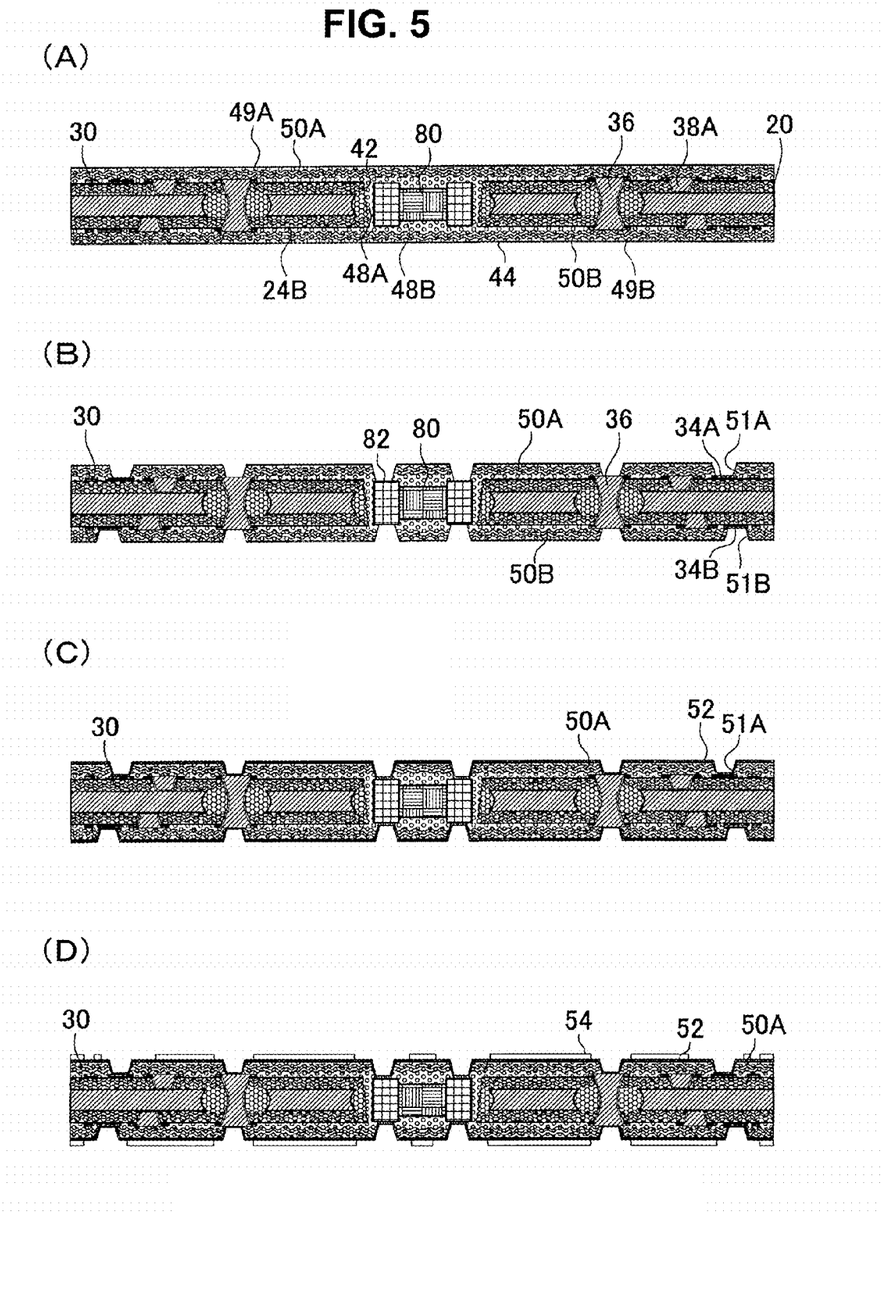
FIGS. 5(A)-(D) are views showing steps of a method for manufacturing a multilayer printed wiring board according to the first embodiment.
Figure 6:
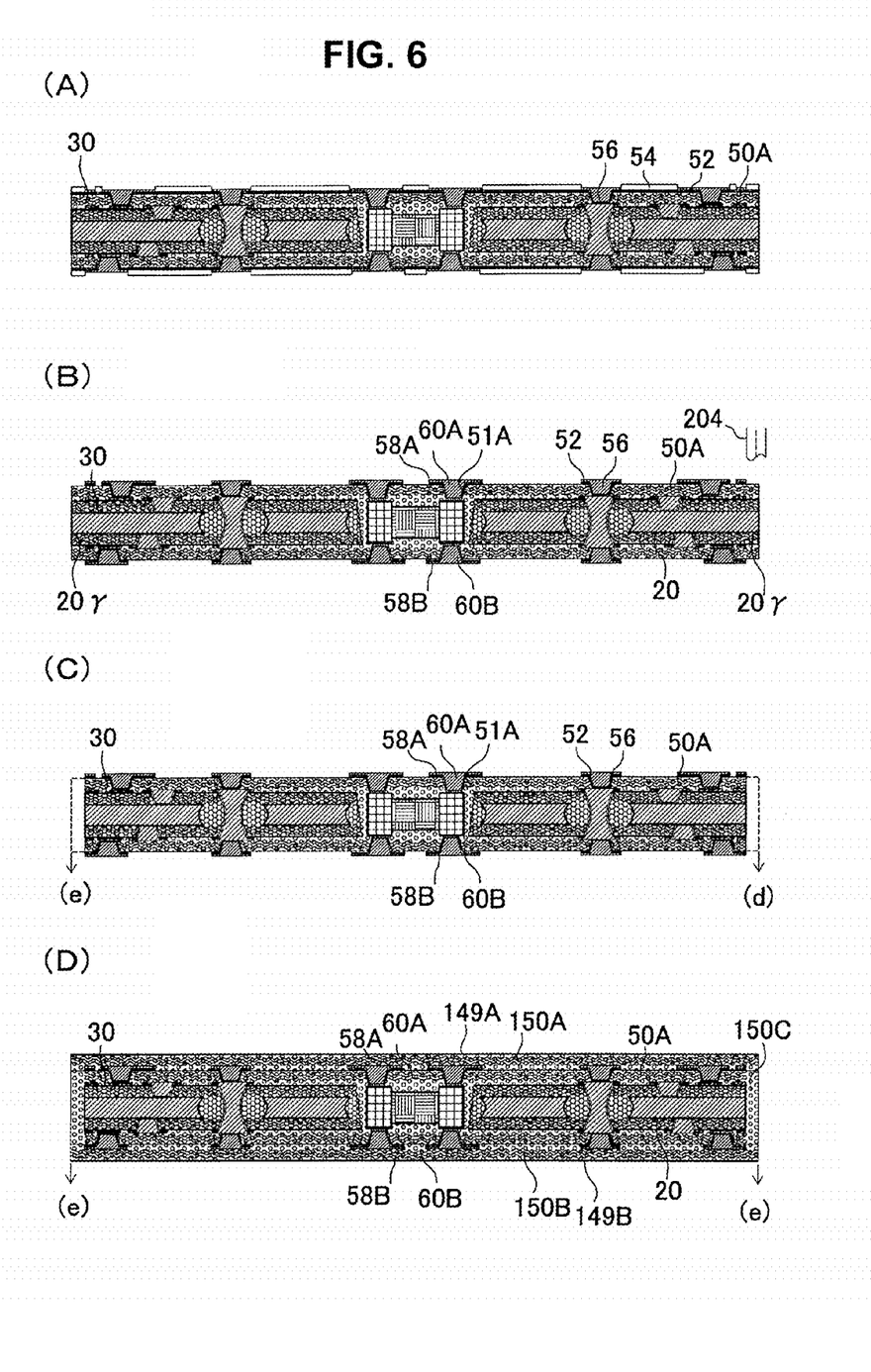
FIGS. 6(A)-(D) are views showing steps of a method for manufacturing a multilayer printed wiring board according to the first embodiment.
Figure 7:
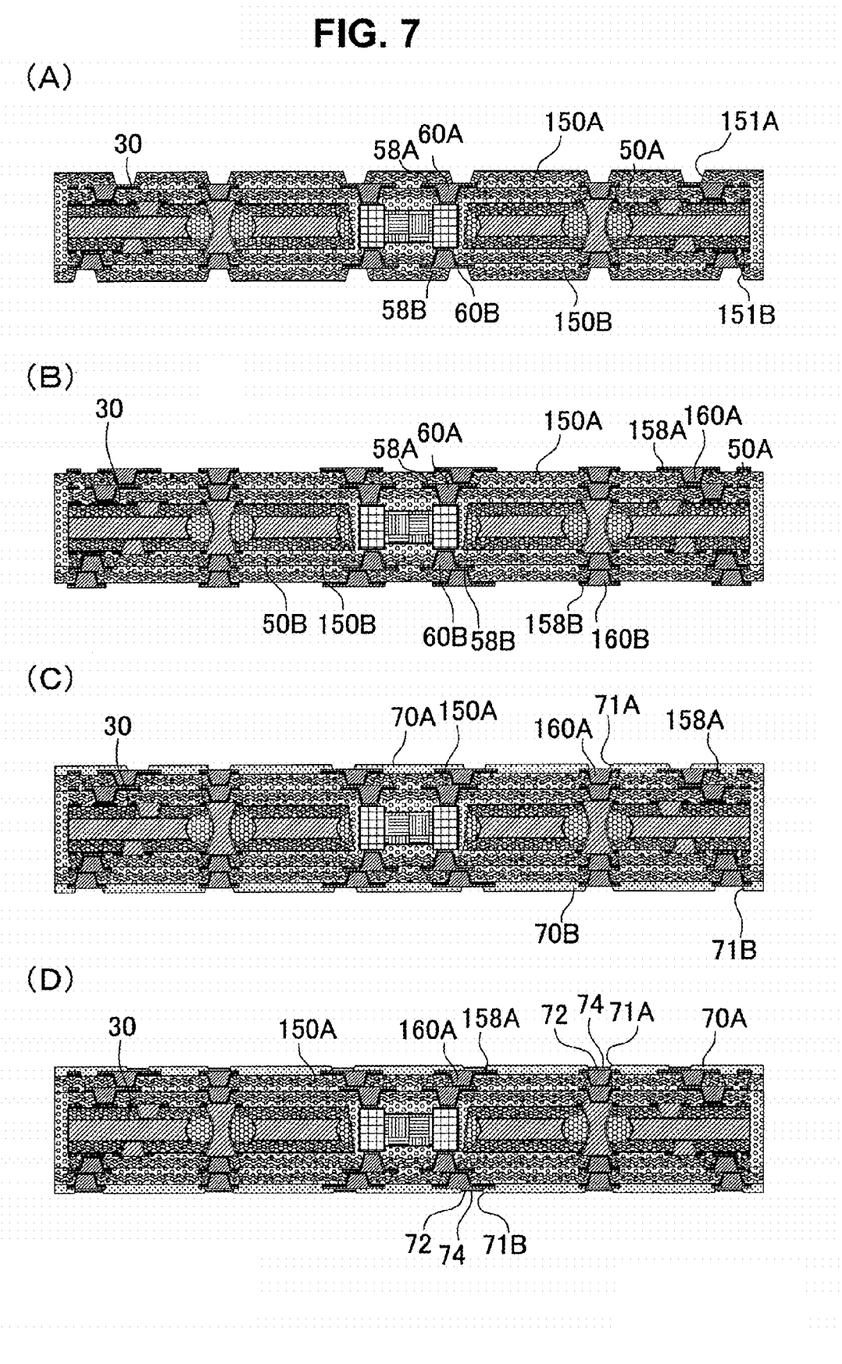
FIGS. 7(A)-(D) are views showing steps of a method for manufacturing a multilayer printed wiring board according to the first embodiment.

(19) Using a $CO_2$ gas laser, via openings (51A, 51B) with a diameter of 75 μm are formed in interlayer insulation layers (50A, 50B) to reach electrodes 82 of capacitor component 80, through-hole conductors 36, first conductive circuits (34A) and second conductive circuits (34B) (see FIG. 5(B)). In FIG. 5, although via conductor openings (51A) are formed on both surfaces (F) and (S) reaching electrodes 82 of capacitor component 80, they may be formed only on either surface (F) or (S). In such a case, via openings (51A) are preferred to be formed on the side where an IC chip is mounted. That is because power loss is less if the distance is shorter between an IC chip and the capacitor component. By immersing the substrate in oxidation agents such as chromic acid and permanganate, surfaces of interlayer insulation layers (50A, 50B) are roughened (not shown in the drawings).

(20) A catalyst such as palladium is attached in advance on surface layers of interlayer insulation layers (50A, 50B), and the substrate is immersed in an electroless plating solution for 5~60 minutes. Accordingly, electroless plated films 52 with a thickness in a range of 0.1~5 μm are formed (FIG. 5(C)).

(21) Photosensitive dry film is attached to substrate 30 after the above treatment, exposed to light and developed to form plating resists 54 with a predetermined pattern (FIG. 5(D)).

(22) Electrolytic plating is performed to form electrolytic plated films 56 in opening portions of the plating resists (see FIG. 6(A)).

(23) After plating resists 54 are removed using a 5% NaOH solution, copper foils 49 and electroless plated films 52 under the plating resists are dissolved and removed by etching using a mixed solution of nitric acid, sulfuric acid and hydrogen peroxide, forming conductive circuits (58A, 58B) and via conductors (60A, 60B) made of copper foil 49, electroless plated film 52 and electrolytic plated film 56 (FIG. 6(B)). Surfaces of conductive circuits (58A, 58B) and via conductors (60A, 60B) are roughened using an etching solution containing copper (II) complex and organic acid (not shown in the drawings).

(24) Drill 204 is aligned with connector (20γ) of metal member 20. FIG. 10(C) is a plan view showing portions of connectors to be cut by drill 204 in a sheet of metal member 20, and FIG. 9(B) is a plan view showing portions of connectors to be cut by drill 204 in sheet 200 with multiple units.

(25) Two connectors (20γ) at each side surface of metal member 20 are cut by a drill (FIG. 6(C)). FIG. 10(D) is a plan view of metal member 20 and core substrate 30 (cross section at "d-d") where eight connectors (20γ) are cut. Using a drill, two each concave portions (20ω) in a concave shape are formed on four side surfaces of metal member 20. FIG. 10(F) is a plan view and FIG. 10(G) is a perspective view, showing metal member 20 where concave portions (20ω) are formed. When a drill is used for cutting, stress is less likely to be exerted on metal member 20 while cutting connectors (20γ). Thus, it is thought that warping caused by stress is less likely to occur in metal member 20 whose strength is lowered due to second penetrating holes (21β), concavo-convex shapes caused by such warping are prevented from occurring on surfaces of insulation layers (24A, 24B), and it is easier to maintain flat surfaces.

(26) Third interlayer insulation layer (150A) with copper foil (149A) is formed on first interlayer insulation layer (50A), and fourth interlayer insulation layer (150B) with copper foil (149B) is formed on second interlayer insulation layer (50B) (FIG. 6(D)). During that time, cut holes of connectors (20γ) formed by drill processing are filled with resin (150C) that has seeped at least from either third interlayer insulation layer (150A) or fourth interlayer insulation layer (150B). FIG. 10(E) is a plan view (cross section at "e-e") showing a state in which resin (150C) that has seeped from either third interlayer insulation layer (150A) or fourth interlayer insulation layer (150B) is provided on side portions of metal member 20. Connectors (20γ) are preferred to be cut by a drill after a capacitor component is accommodated in a fourth penetrating hole of the core substrate and is secured by the first and second interlayer insulation layers. If a process to secure a capacitor component by filling resin in a fourth penetrating hole and a process to fill resin in cut holes of connectors are conducted at the same time, it is thought that filling resin from only the first and second interlayer insulation layers may end up with an insufficient result.

(27) Openings (151A, 151B) are formed in third interlayer insulation layer (150A) and fourth interlayer insulation layer (150B) in the same way as in step (16) above (FIG. 7(A)), and conductive circuits (158A, 158B) and via conductors (160A, 160B) are formed for third interlayer insulation layer (150A) and fourth interlayer insulation layer (150B), the same as in steps (17)~(23) above (FIG. 7(B)).

(28) A commercially available solder-resist composition is applied, exposed to light and developed. Accordingly, solder-resist layers (70A, 70B) with openings (71A, 71B) are formed (FIG. 7(C)). The layer thickness of solder-resist layers (70A, 70B) is 15 μm.

(29) The substrate is immersed in an electroless nickel-plating solution to form 5 μm-thick nickel-plated layers 72 in openings (71A, 71B). Then, the substrate is immersed in an electroless gold-plating solution to form 0.03 μm-thick gold-plated layers 74 on the nickel-plated layers 72 (FIG. 7(D)). Nickel-palladium-gold layers may also be formed instead of nickel-gold layers.

(30) Next, solder balls are loaded in openings (71A), a reflow is conducted to form solder bumps (76A) on the first-surface (surface (F)) side and solder bumps (76B) on the second-surface (surface (S)) side. Multilayer printed wiring board 10 is completed (FIG. 8). Then, the panel is cut along two-dot chain lines (Z) shown in FIG. 9(B) so that the panel is divided into individual multilayer printed wiring boards. Two-dot chain lines (Z) pass through drilled penetrating holes. Inorganic fiber is not present on four side surfaces of printed substrate 10, and portions of drilled penetrating holes filled with resin that has seeped out from interlayer insulation layers are exposed.

IC chip 90 not shown in the drawings is mounted on multilayer printed wiring board 10 by connecting pads 92 of IC chip 90 to solder bumps (76A).

In the method for manufacturing a multilayer printed wiring board according to the first embodiment, metal sheet 200 of multiple units is used where each side of metal member 20 is supported by connectors (20γ), and then, after first interlayer insulation layer (50A) and second interlayer insulation layer (50B) are laminated, two connectors (20γ) on each side surface of metal member 20 are cut by a drill. At that time, concave portions are formed to be recessed in an arc shape toward the center in a planar direction so that connectors (20γ) do not protrude from metal member 20. Therefore, it is thought that thermal stress is not concentrated on specific portions of metal member 20, and cracking is less likely to occur during heat cycles at connected portions of metal member 20 and insulation layers (24A, 24B) and interlayer insulation layers (50A, 50B), enhancing reliability. In addition, since connectors (20γ) are cut by a drill after a capacitor component is accommodated in a fourth penetrating hole of the core substrate and is secured by the first and second interlayer insulation layers, the capacitor component is secured by resin filled in the fourth penetrating hole, and cut holes of the connectors are securely filled with resin. Accordingly, voids are thought to be suppressed, and thus reliability is enhanced. Also, it is thought that stress is less likely to be exerted on metal member 20 while cutting connectors (20γ), warping caused by stress is less likely to occur in metal member 20 whose strength is lowered due to second penetrating holes (21β), concavo-convex shapes caused by such warping are prevented from occurring on surfaces of first interlayer insulation layer (50A) and second interlayer insulation layer (50B), and it is easier to maintain flat surfaces. Accordingly, third interlayer insulation layer (150A), fourth interlayer insulation layer (150B), conductive circuits (158A, 158B) and via conductors (160A, 160B) are laminated to be built up on flat first interlayer insulation layer (50A) and second interlayer insulation layer (50B), thus reliability of conductive circuits (158A, 158B) is thought to be enhanced.

A manufacturing method according to an embodiment of the present invention includes the following: preparing a metal layer which is formed with multiple metal members and connectors connecting individual metal members, and which has a first surface and a second surface opposite the first surface; forming a first penetrating hole and a second penetrating hole in the metal member; forming a first insulation layer on the first surface of the metal layer; forming a second insulation layer on the second surface of the metal layer; filling resin material in the first penetrating hole and the second penetrating hole; in the first insulation layer, the second insulation layer and the resin material, forming a third penetrating hole inside the first penetrating hole; on the first insulation layer and the second insulation layer, forming a first conductive circuit and a second conductive circuit respectively; in the third penetrating hole, forming a through-hole conductor which connects the first conductive circuit and the second conductive circuit; in the first insulation layer, the second insulation layer and the resin material, forming a fourth penetrating hole inside the second penetrating hole; forming a supporter on a surface of the second insulation layer; accommodating an electronic component in the fourth penetrating hole; forming a first interlayer insulation layer on the first insulation layer; filling resin material in the fourth penetrating hole; removing the supporter; forming a second interlayer insulation layer on the second insulation layer; in the first interlayer insulation layer and the second interlayer insulation layer, forming via conductors which reach the through-hole conductor and terminals of the electronic component; cutting the connector to form a cut penetrating hole; forming a third interlayer insulation layer on the first interlayer insulation layer; forming a fourth interlayer insulation layer on the second interlayer insulation layer; and in the cut penetrating hole, filling at least either the third interlayer insulation layer or the fourth interlayer insulation layer.

In a method for manufacturing a multilayer printed wiring board according to an embodiment of the present invention, after multiple metal members and connectors connecting individual metal members are cut by a drill, resin is filled in the cut holes, and then each unit is cut along the cut holes. Thus, cut portions of the metal are not exposed on side surfaces of a substrate. Since the cut metal portions are not exposed, delamination and cracking, which are caused by differences in thermal expansion coefficients, oxidation corrosion or the like at protruding portions, are prevented from occurring. The reliability of conductive circuits is thought to be enhanced.

In a method for manufacturing a multilayer printed wiring board according to an embodiment of the present invention, an electronic component built into a core substrate is accommodated in a penetrating hole of the core substrate and then is secured in the penetrating hole by an interlayer insulation layer laminated on its upper portion and on the core substrate. On the other hand, cut holes of connectors are filled by an interlayer insulation layer further laminated on that interlayer insulation layer. Thus, the penetrating hole and cut holes are sufficiently filled with resin, and the reliability of conductive circuits is thought to be enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board, comprising: a core substrate comprising a metal member and having a first surface and a second surface on an opposite side of the first surface; a first buildup structure comprising a first insulation layer formed on the first surface of the core substrate, a first conductive circuit formed on the first insulation layer and a plurality of interlayer insulation layers; a second buildup structure comprising a second insulation layer formed on the second surface of the core substrate, a second conductive circuit formed on the second insulation layer and a plurality of interlayer insulation layers; a through-hole conductor penetrating through the core substrate, the first insulation layer and the second insulation layer such that the through-hole conductor is connecting the first conductive circuit and the second conductive circuit; and an electronic component accommodated in an accommodation portion formed through the core substrate, the first insulation layer and the second insulation layer, wherein the metal member of the core substrate has a side surface having a concave portion which is recessed toward center of the metal member in a planar direction with respect to the core substrate, and the concave portion is covered with a resin derived from at least one of the interlayer insulation layers, wherein: the plurality of interlayer insulation layers of the first buildup structure includes a first interlayer insulation layer formed on the first insulation layer such that the first interlayer insulation layer covers the first conductive circuit and the electronic component and a third interlayer insulation layer formed on the first interlayer insulation layer; the plurality of interlayer insulation layer of the second buildup structure includes a second interlayer insulation layer formed on the second insulation layer such that the second interlayer insulation layer covers the second conductive circuit and the electronic component and a fourth interlayer insulation layer formed on the second interlayer insulation layer; the metal member has a first penetrating hole, a first filler filling the first penetrating hole, a second penetrating hole and a second filler filling the second penetrating hole; the through-hole conductor is formed inside a third penetrating hole penetrating through the first insulation layer, the second insulation layer and the first filler; the electronic component is accommodated in a fourth penetrating hole forming the accommodation portion and penetrating through the first insulation layer, the second insulation layer and the second filler; and the fourth penetrating hole is filled with a third filler such that the electronic component is secured in the accommodation portion, wherein each of the first and second filler is a resin derived from at least one of the first insulation layer and the second insulation layer, and the third filler is a resin derived from at least one of the first interlayer insulation layer and the second interlayer insulation layer.

2. The multilayer printed wiring board according to claim 1, wherein the electronic component is one of a capacitor component, a resistor component, an inductor component, an IC chip and a wiring board.

3. The multilayer printed wiring board according to claim 1, wherein the concave portion on the side surface of the metal member portion has an arc shape.

4. The multilayer printed wiring board according to claim 1, wherein the third penetrating hole has a first portion tapering from the first surface of the core substrate toward the second surface of the core substrate and a second portion tapering from the second surface of the core substrate toward the first surface of the core substrate.

* * * * *